United States Patent
Theuss

(10) Patent No.: US 9,324,586 B2
(45) Date of Patent: Apr. 26, 2016

(54) CHIP-PACKAGING MODULE FOR A CHIP AND A METHOD FOR FORMING A CHIP-PACKAGING MODULE

(75) Inventor: Horst Theuss, Wenzenbach (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 13/211,408

(22) Filed: Aug. 17, 2011

(65) Prior Publication Data

US 2013/0043575 A1    Feb. 21, 2013

(51) Int. Cl.
*H01L 23/495* (2006.01)
*H01L 21/56* (2006.01)
*H01L 23/31* (2006.01)
*H01L 23/00* (2006.01)

(52) U.S. Cl.
CPC .......... *H01L 21/565* (2013.01); *H01L 23/3107* (2013.01); *H01L 23/4951* (2013.01); *H01L 23/562* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/291* (2013.01); *H01L 2224/2919* (2013.01); *H01L 2224/32245* (2013.01); *H01L 2224/4826* (2013.01); *H01L 2224/48091* (2013.01); *H01L 2224/48247* (2013.01); *H01L 2224/48465* (2013.01); *H01L 2224/73215* (2013.01); *H01L 2224/73265* (2013.01); *H01L 2224/83191* (2013.01); *H01L 2224/92147* (2013.01); *H01L 2924/07811* (2013.01); *H01L 2924/10253* (2013.01); *H01L 2924/1461* (2013.01); *H01L 2924/1815* (2013.01)

(58) Field of Classification Search
CPC ................. H01L 2924/00; H01L 2924/00014; H01L 2224/48227; H01L 2224/97; H01L 2224/73265; H01L 31/0203; H01L 2924/14; H01L 2225/06513; H01L 2924/0665; H01L 29/84; H01L 2224/02372; H01L 2224/16147; H01L 23/315; H01L 24/06; H01L 21/563
USPC ........... 257/414–420, 666–667, 678, 690, 81, 257/99, 100, 433, 434, 787–796
See application file for complete search history.

(56) References Cited

U.S. PATENT DOCUMENTS

| | | | |
|---|---|---|---|
| 6,140,144 A | 10/2000 | Najafi et al. | |
| 6,443,179 B1* | 9/2002 | Benavides et al. | 137/454.2 |
| 6,509,636 B1* | 1/2003 | Tsai et al. | 257/678 |
| 6,982,491 B1* | 1/2006 | Fan et al. | 257/778 |
| 6,987,312 B2 | 1/2006 | Theuss | |
| 7,015,579 B2 | 3/2006 | Okada et al. | |

(Continued)

FOREIGN PATENT DOCUMENTS

| | | |
|---|---|---|
| CN | 1533741 A | 10/2004 |
| DE | 10205127 A1 | 8/2003 |
| DE | 10228593 A1 | 1/2004 |

*Primary Examiner* — Colleen A Matthews
*Assistant Examiner* — Junaiden Mirsalahuddin

(57) ABSTRACT

A chip-packaging module for a chip is provided, the chip-packaging module including a chip including a first chip side, wherein the first chip side includes an input portion configured to receive a signal; a chip carrier configured to be in electrical connection with the first chip side, wherein the chip is mounted to the chip carrier via the first chip side; and a mold material configured to cover the chip on at least the first chip side, wherein at least part of the input portion is released from the mold material.

23 Claims, 5 Drawing Sheets

(56) References Cited

U.S. PATENT DOCUMENTS

| | | |
|---|---|---|
| 7,319,598 B2 | 1/2008 | Steiner et al. |
| 7,495,325 B2 | 2/2009 | Abela |
| 7,745,916 B2 | 6/2010 | Theuss |
| 2004/0188838 A1* | 9/2004 | Okada et al. .................. 257/738 |
| 2005/0046044 A1 | 3/2005 | Theuss |
| 2005/0201901 A1* | 9/2005 | Grossman et al. ............ 422/100 |
| 2006/0126313 A1 | 6/2006 | Steiner et al. |
| 2006/0266938 A1* | 11/2006 | Abela ........................... 250/239 |
| 2007/0151856 A1* | 7/2007 | Fazzio et al. .................. 204/605 |
| 2008/0122051 A1* | 5/2008 | Theuss .......................... 257/678 |
| 2009/0026558 A1* | 1/2009 | Bauer et al. ................... 257/414 |
| 2010/0224945 A1* | 9/2010 | Takahata et al. .............. 257/415 |
| 2012/0139067 A1* | 6/2012 | Lo et al. ........................ 257/417 |

\* cited by examiner

Prior Art

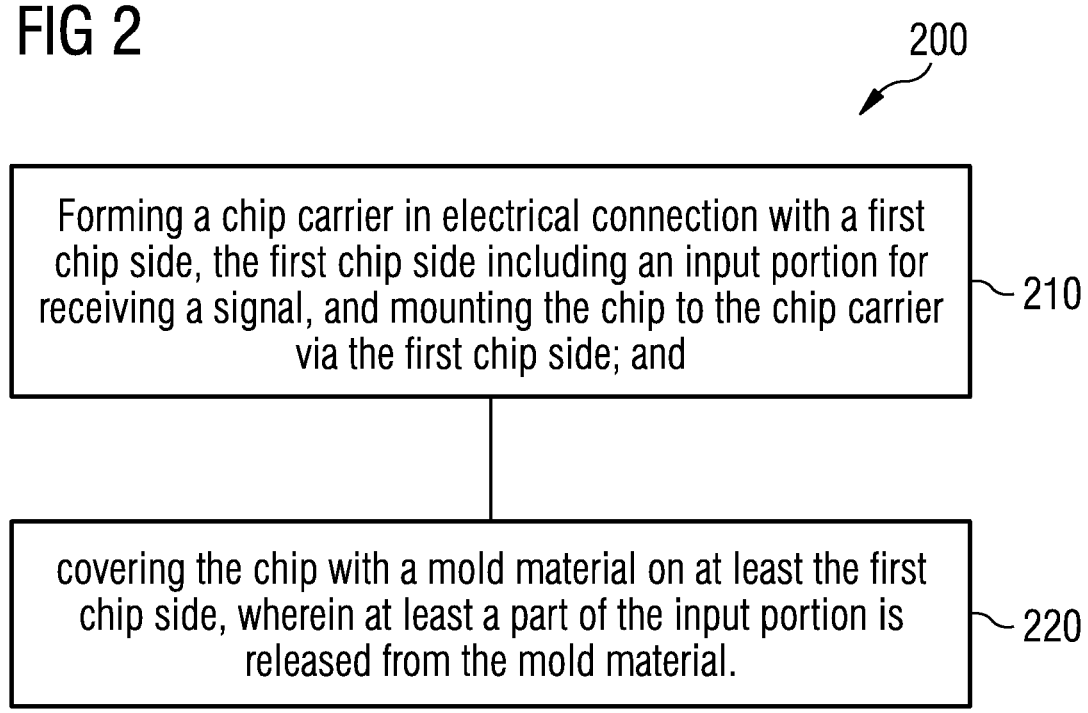

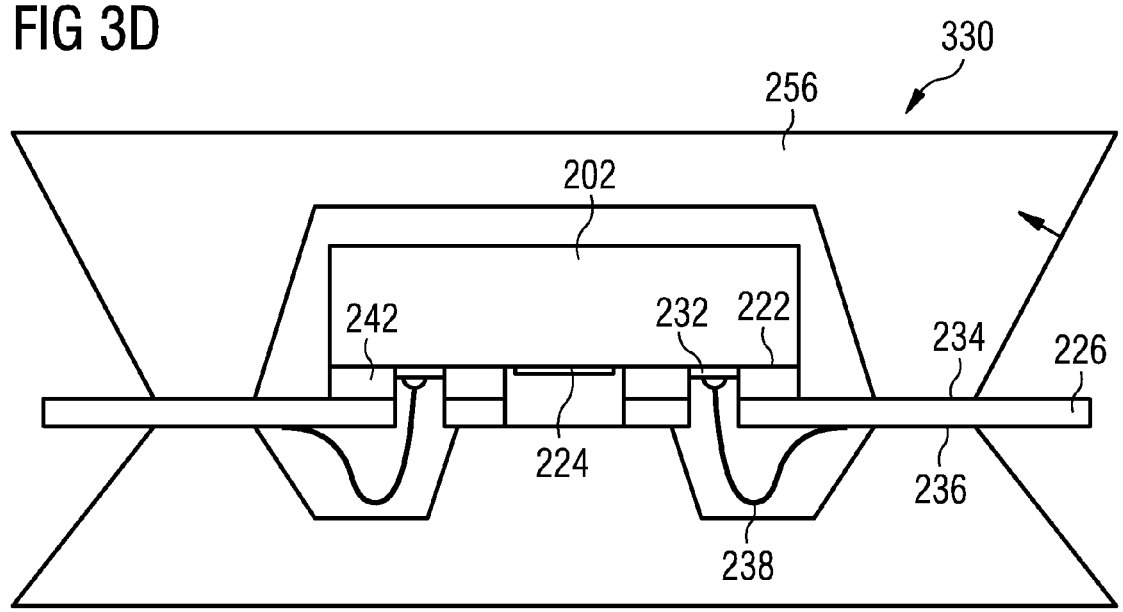
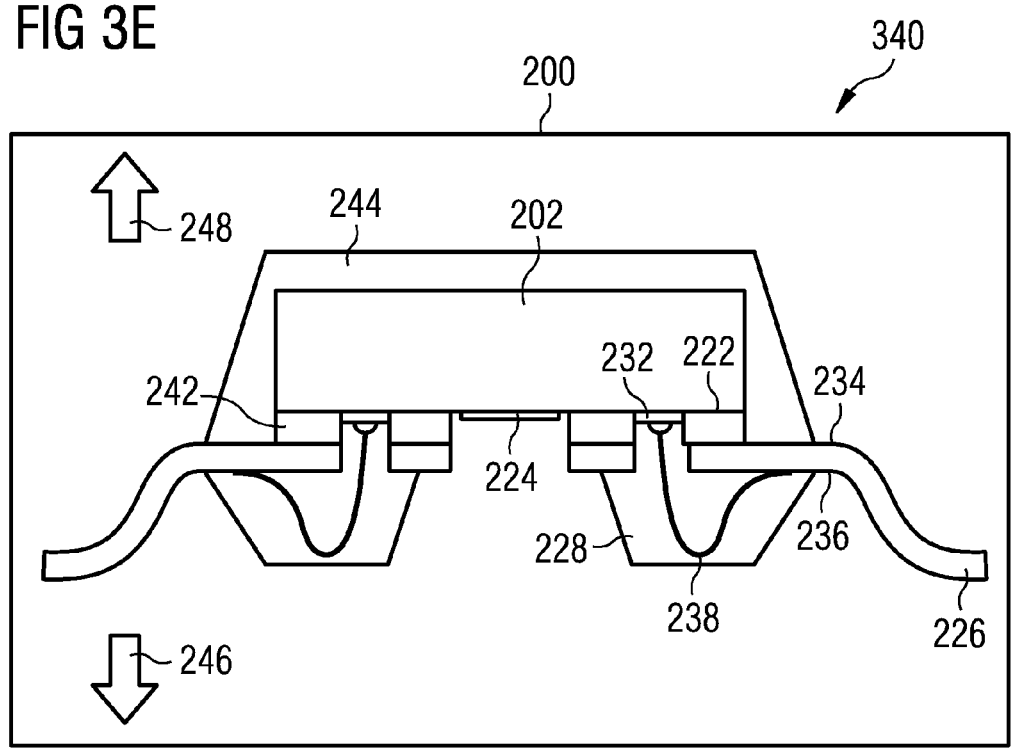

CHIP-PACKAGING MODULE FOR A CHIP AND A METHOD FOR FORMING A CHIP-PACKAGING MODULE

TECHNICAL FIELD

The present invention relates generally to a chip-packaging module and a method for forming a chip-packaging module.

BACKGROUND

Several processing challenges surround the production of chip packaging modules for housing a chip. In chip packaging manufacturing, a chip is often covered by mold material, which protects the chip. Some chips in particular, may require that a portion of the chip is left uncovered, e.g. chips with sensors. In such cases, care is needed to ensure that the mold tool does not hit or destroy the chip, when attempting to leave a portion of the chip uncovered. FIG. 1A shows a prior art pre-molded cavity package 100 wherein a pre-molded cavity formed from a mold material 104, 104a may be used to house a chip 102. A leadframe 106 may form part of the cavity package before chip 102 is inserted into the cavity. Chip 102 may be adhered to leadframe 106 on a bottom side of chip 102. Top side of chip 102 may have electrical contacts 108 which may be connected via a connection 112, e.g. a conductive wire, to leadframe 106. The casting of soft gel 114 over chip 102 is a necessary step, which raises questions with respect to performance, reliability, and with respect to the production of bubbles in soft gel 114.

FIG. 1B shows a cavity package 110 in which a chip 102 may be sealed with a mold material 104a over chip 102, wherein mold material 104a may be in connection with chip 102, e.g. in connection with a chip top side, through the use of a molding tool. Chip 102 may be adhered to leadframe 106 on a bottom side of chip 102. The complicated mold process risks damaging chip 102, e.g. a chip die, as the molding tool needs to be sealed on chip 102 directly.

FIGS. 1C and 1D show cavity packages 120 and 130 respectively in which a soft polymer drop 114 may be deposited on chip 102 in FIG. 1C and a soft polymer casting 114a may be deposited on chip 102 in FIG. 1D, e.g. over a surface on a top side of chip 102. Chip 102 may be adhered to leadframe 106 on a bottom side of chip 102. The chip 102 may be sealed with mold material 104a in connection with chip 102, e.g. in connection with a chip top side, and soft polymer drop 114 in FIG. 1C and soft polymer casting 114a in FIG. 1D. For example, mold material 104 may cover chip 102 from a bottom side, and mold material 104a may cover chip 102 from a top side. In manufacturing the cavity package of FIG. 1C, chip 102 may be sealed with the molding tool on soft polymer drop 114. In manufacturing the cavity package of FIG. 1D, chip 102 may be sealed with the molding tool on soft polymer casting 114a. The complicated mold process risks contaminating the mold tool. The method further requires a complicated gel casting process which poses difficulties in manufacturing reproducibility. Even though the above methods may be used on sensor surfaces, they are limited to be used on surfaces which can tolerate gel coverage, which may exclude most electrical, mechanical and electromechanical sensors. Furthermore, as gel casting is a necessary step, this may affect the performance of the chip.

SUMMARY

Various embodiments provide a chip-packaging module for a chip, the chip-packaging module including a chip including a first chip side, wherein the first chip side includes an input portion configured to receive a signal; a chip carrier configured to be in electrical connection with the first chip side, wherein the chip is mounted to the chip carrier via the first chip side; and a mold material configured to cover the chip on at least the first chip side, wherein at least part of the input portion is released from the mold material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for forming a chip-packaging module according to various embodiments; and FIGS. 3A to 3G show a method for forming a chip-packaging module as shown in FIGS. 3E, 3F, and 3G, according to various embodiments.

DESCRIPTION

The following detailed description refers to the accompanying drawings in FIGS. 2 and 3 A-G that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments relate to a concept for a small molded housing for electronic components.

FIG. 2 shows a method 200 for forming a chip-packaging module according to an embodiment; the method including forming a chip carrier in electrical connection with a first chip side, the first chip side including an input portion for receiving a signal, and mounting the chip to the chip carrier via the first chip side (in 210); and covering the chip with a mold material on at least the first chip side, wherein at least part of the input portion is released from the mold material (in 220).

Figure 3A:
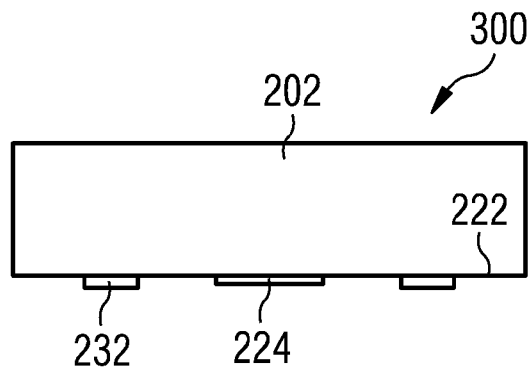
Figure 3B:
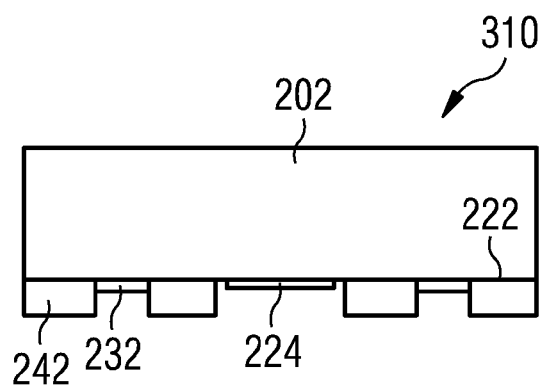
Figure 3C:
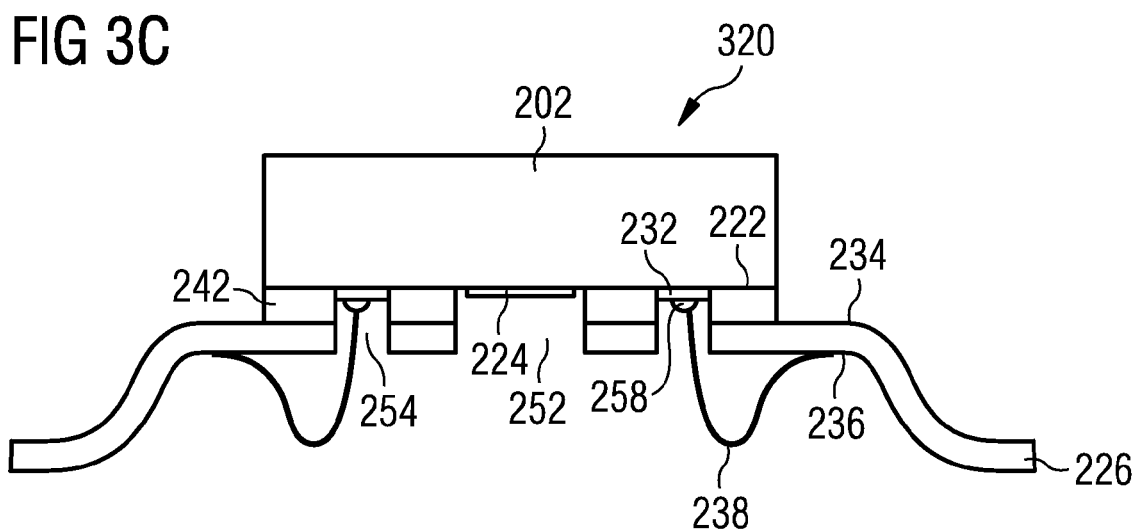
Figure 3F:
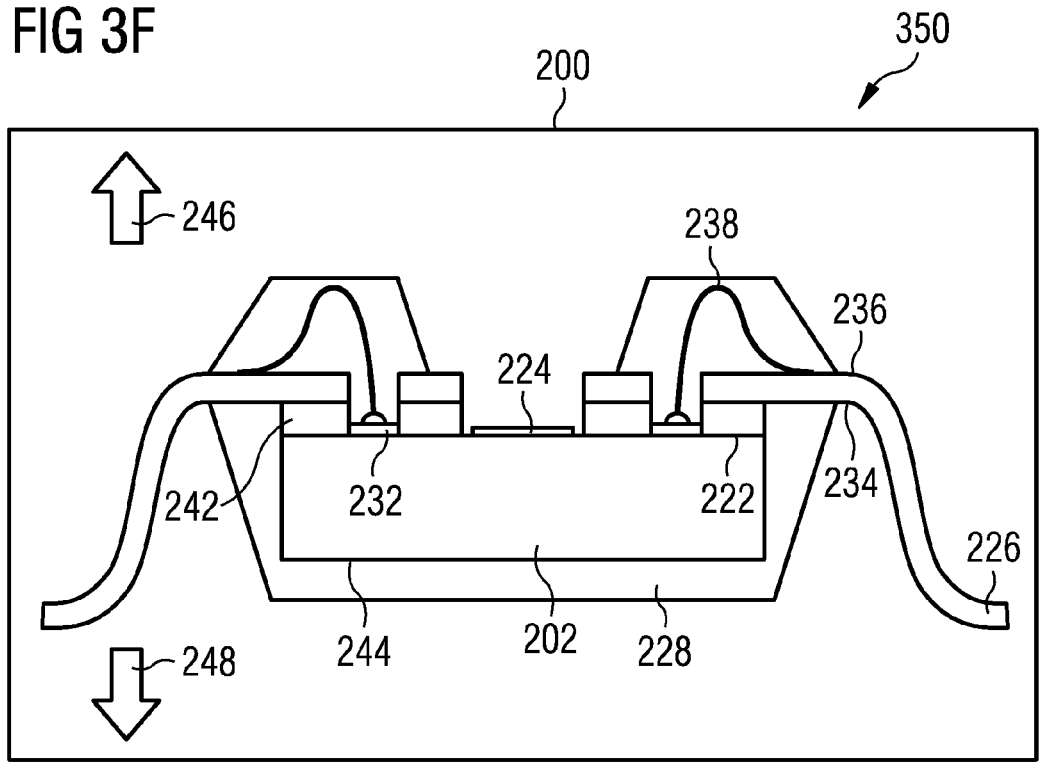
Figure 3G:
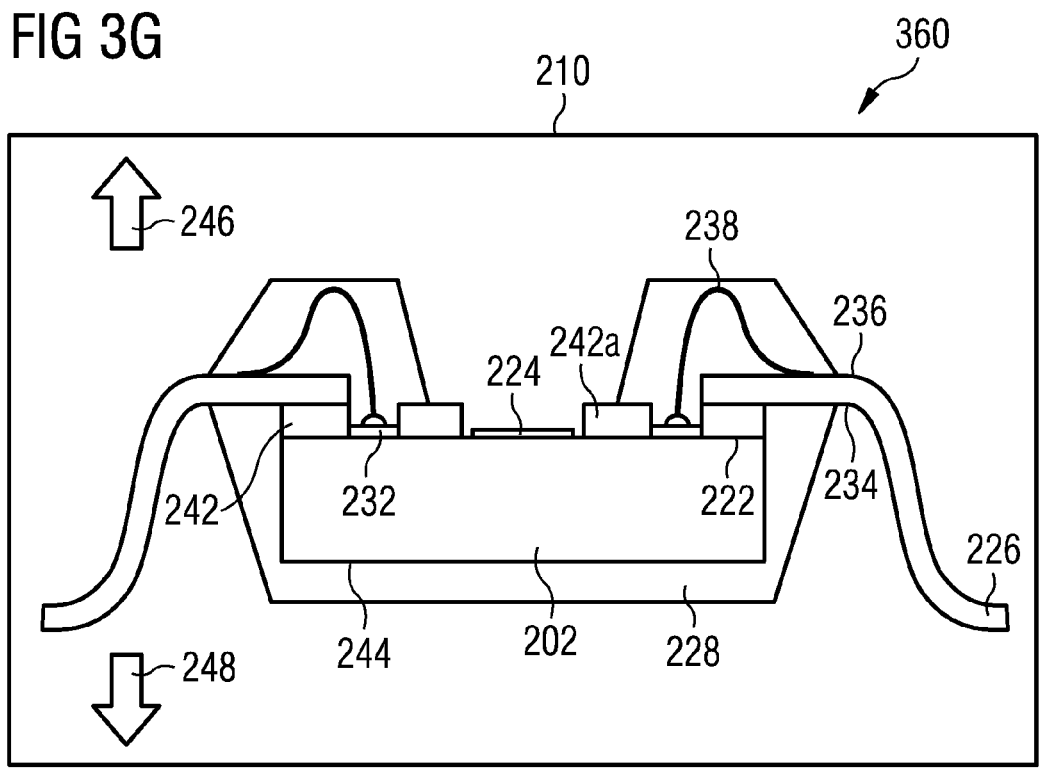

FIGS. 3A to 3G show illustrations of the method for forming a chip-packaging module according to FIG. 2. FIGS. 3E, 3F and 3G show a chip-packaging module according to various embodiments.

Figure 1A:
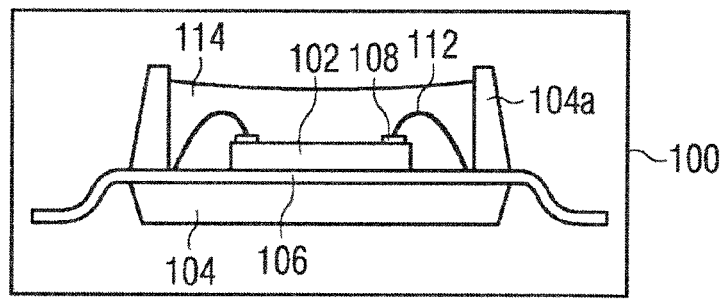
FIGS. 1A to 1D show cavity chip packages.
Figure 1B:
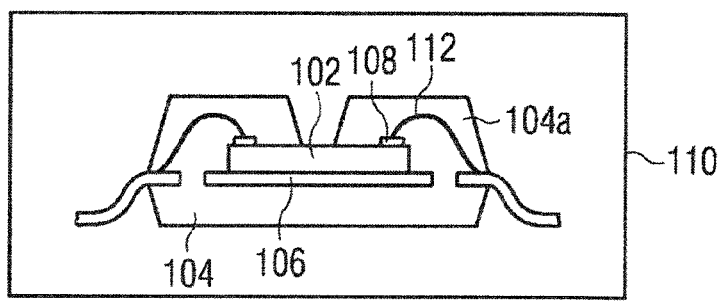
Figure 1C:
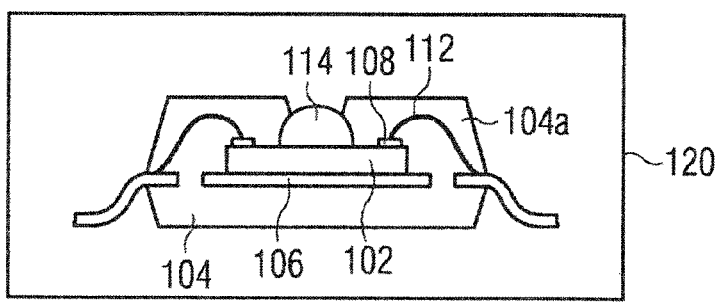
Figure 1D:
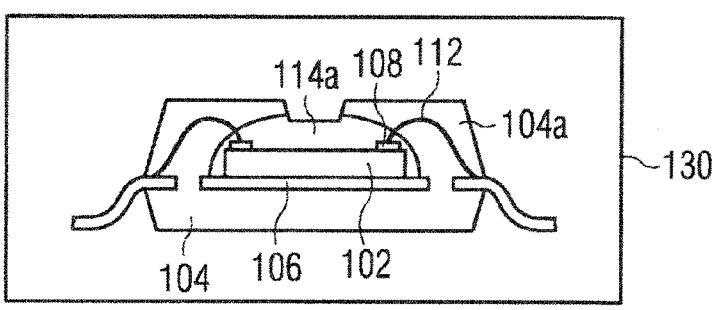

In FIG. 3A, as shown in illustration 300, a chip 202 includes a first chip side 222. Chip 202, e.g. a sensor chip, may include an input portion 224, e.g. a sensor area 224, formed on first chip side 222, e.g. its active side. Input portion 224 may include a membrane. The membrane may be configured to include an electromechanical structure, e.g. a MEMS structure. One or more connection pads 232, e.g.

electrical contacts, may be formed on first chip side 222, e.g. its active side. The one or more connection pads 232 may be formed on the same side as the input portion 224. Chip 202 may include a sensor, e.g. a MEMS sensor, a pressure sensor, gas sensors, wherein input portion 224 may include a sensing area for receiving signals to be processed by chip 202. Chip 202 may include general sensors in which an open access to the active chip surface, e.g. on first chip side 222, may be provided. In some cases a signal inlet may be provided for receiving an input signal, in which case direct contact with a chemical substance may be provided during the sensing. In other words, opposite to the cavity packages of FIGS. 1C and 1D, any of soft polymer drop 114 and soft polymer casting 114a may not be suitable for covering first chip side 222 in such an embodiment. The chip may include MEMS sensors, in which a chip surface on the first side 222 which is at least partially exposed to the environment may be necessary. Examples of such sensors include actuators, pumps and other moving structures, e.g. MEMS structures, which may not be encapsulated or sprayed. In various embodiments, access to chip 202 provides access through a housing for a chip to the chip. Chip 202 may include at least one of a semiconductor material, e.g. silicon. Chip 202 may include at least one of the following group of materials, the group consisting of plastic, glass and polymer.

As shown in illustration 310 of FIG. 3B, layer 242, e.g. a buffer layer, may be deposited on first chip side 222. Buffer layer 242 may be selective applied or structured, e.g. selectively positioned and shaped over first chip side 222. Buffer layer 242 may include at least one from the following group of materials, the group consisting of: adhesive glue, epoxy, solder, double-sided tape, elastic polymer, resist, polyimide, bistage material which acts as an adhesive after thermal treatment, and thermal adhesive. Buffer layer 242 may be further configured to isolate input portion 224 from one or more connection pads 232 formed on first chip side 222. Buffer layer 242 may be thicker than connection pads 232. Buffer layer 242 may be deposited by at least one of spin-coating and printing. Buffer layer 242 may be formed by the pre-application of foil, e.g. kaptop foil. Buffer layer 242 may have a thickness ranging from about 5 µm to about 200 µm, e.g. about 10 µm to about 100 µm, e.g. about 20 µm to about 50 µm. Spin-coating may result in the deposition of buffer layer 242 having a thickness of between about 5 µm to about 10 µm. Printing may result in the deposition of buffer layer 242 having a thickness of between about 50 µm to about 200 µm. Pre-application of foil may result in the deposition of buffer layer 242 having a thickness of between about 50 µm to about 150 µm.

As shown in illustration 320 of FIG. 3C, Chip 202 may be attached to chip carrier 226. Chip 202 may be mounted to chip carrier 226 via first chip side 222. Chip carrier 226 may be formed on first chip side 222. In other words, chip carrier 226 may be positioned on the first chip side 222. Chip carrier 226 may include a chip carrier side 234 adhered to part of first chip side 222. Buffer layer 242 may be configured to adhere at least part of chip carrier side 234 to at least part of first chip side 222. Buffer layer 242 may be further configured to adhere chip 202 to chip carrier 226 without chip carrier 226 being in direct contact with chip 202. Buffer layer 242 may lie between first chip side 222 and chip carrier 226. First chip side 222 may be adhered with adhesive buffer layer 242 e.g. joined by glue, soldered, to chip carrier 226 e.g. a leadframe. Chip 222 may be arranged such that first chip side 222 faces downwards, and is adhered to chip carrier 226.

Input portion 224 may be exposed, e.g. may be made visible, e.g. may be made accessible to the environment, during a process which creates an opening 252, e.g. a hole, in chip carrier 226. Connection pads 232, e.g. electrical contacts, e.g. wire bond pads, may be exposed, e.g. exposed to the environment, through creating corresponding openings 254, e.g. holes, in chip carrier 226.

Chip carrier 226 may be configured to be in electrical connection with first chip side 222, wherein at least one wire 238 may be configured to provide the electrical connection between first chip side 222 and chip carrier 226, e.g. between at least one of the one or more connection pads 232 formed on first chip side 222 and chip carrier 226. At least one wire 238 may be configured to feed signals processed by the chip from the signal received by input portion 224 to chip carrier 226. At least one wire 238 may be adhered to the one or more connection pads 232 by using an adhesive 258, e.g. glue, solder material. Chip carrier 226 may include further chip carrier side 236 configured to be in electrical connection with first chip side 222, e.g. wire 238 may be configured to provide the electrical connection between first chip side 222 and further chip carrier side 236, e.g. between at least one of the one or more connection pads 232 formed on first chip side 232 and further chip carrier side 236.

As shown in illustration 330 of FIG. 3D, an overmold process may be carried out so that subsequently, an encapsulation molding process, e.g. injection molding, may be carried out, followed by packaging using standard processes, e.g. isolation, testing, packing. The overmold process may be carried out before the trim and form process.

An advantage is that during the overmold process, the mold tool 256, instead of being directly placed on chip 202, may be placed on chip carrier 226 instead, avoiding damage being made to chip 202. The placement of the injection tool on the chip carrier 226 is relatively less critical. The injection tool must be sealed cleanly during the injection process.

As shown in illustration 340 of FIG. 3E, an encapsulation process, which may include injection molding of mold material 228, into mold tool 256, may be carried out. Mold material 228 may be configured to cover chip 200 on at least first chip side 222, wherein at least part of input portion 224 is released from mold material 228. In other words, at least part of input portion 224 may not be covered by mold material 228. In other words, at least part of input portion 224 may have open access to receiving an external signal. An external signal may be a signal that is not relayed from within the chip. The external signal may include at least one from the following group of signals, the group consisting of: motion signals, mechanical signals, electrical signals, chemical signals, pressure signals and gaseous signals. Mold material 228 may be configured to cover at least part of chip carrier 226, e.g. further chip carrier side 236, wire 238, and one or more connection pads 232, which may be formed on first chip side 222. Mold material 228 may include a material selected from a group consisting of: filled or unfilled epoxy, pre-impregnated composite fibers, laminate, thermoset and thermoplastic material.

Mold material 228 may be further configured to cover chip 202 on at least a second chip side 244, wherein second chip side 244 faces a direction opposite to the first chip side 222, and further configured to cover at least part of chip carrier side 234. If first chip side 222 faces a first direction 246, then second chip side 244 faces an opposite second direction 248.

The overmold and mold injection process may be carried out after the adherence of chip 202 to chip carrier 226. A trim and form process may be carried out on chip carrier 226 following the overmold and mold process.

According to an alternative embodiment as shown in illustration 350 of FIG. 3F, the arrangement illustrated in 340 may be positioned, e.g. rotated by varying amounts, e.g. rotated by 180°, so that connecting wires 238, e.g. connecting bonded wires, may be drawn, thereby providing an alternative trim and form option.

According to an alternative embodiment as shown in illustration 360 of FIG. 3G, mold material 228 may be formed over, e.g. directly on, at least part of buffer layer 242 as well as on leadframe 226. Therefore, certain parts of buffer layer 242, such as buffer layer 242a need not be covered by leadframe 226.

Chip 202 may include at least one from the following group of sensors, the group consisting of: electrical sensors, mechanical sensors, electromechanical sensors, microelectromechanical sensors, pressure sensors, gas sensors, chemical sensors, biological sensors, pumps and actuators. Input portion 224 may include a sensing surface. configured to receiving an external signal. Input portion 224 may include membranes which may be used for pressure sensing and acoustical sensors, e.g. microphones; metal oxides for gas sensing, e.g. metal oxides which may change their resistance after exposure to a gas; DNA-spots, which show a sensing reaction when in contact with an external substance. Input portion 224 may include a transistor gate, e.g. a CMOS transistor gate, which may vary the transistor gain upon interaction with an external substance. Input portion 224 may comprise at least one of silicon, polysilicon, single crystalline silicon, which may be configured as a sensor. Input portion 224 may further include a protection layer, e.g. a passivation layer, oxide, nitride, imide, as long as it does not damage the sensor function, or limit the ability of input portion 224 to sense an external signal. Input portion 224 may include a membrane, and may be configured to receive at least one from the following group of signals: motion, mechanical, electrical, chemical, pressure and gaseous. Chip 202 may include a lab-on-chip (laboratory-on-chip). A lab-on-chip may include a chip including a sensor on a chip, wherein the sensor may be configured to process laboratory tests. For examples, input portion 224 may include a sensing surface for receiving signals, e.g. signals from biological molecules, cells, liquids, chemical assays, immunoassays, and chip 202 may include an electrical circuit for processing the received signals.

Chip carrier 226 may include at least one of a leadframe and a laminate, e.g. ceramic laminate and organic laminate. Chip carrier 226 may be preferably a metallic substance and may include at least one of the following: an organic material, a ceramic material, a single layer or multilayer substrate.

According to an embodiment, the introduction of a gentle, careful assembly of one or more chips 202 on chip carrier 226 may be made. Gentle careful assembly may be carried out, for example, through the introduction of buffer layer 242, e.g. a mechanical stress buffer, e.g. a sealing ring, e.g. a sealing structure material deposited on chip 202. A preferable variant is one by which an adhesive, e.g. a glue, e.g. a glue similar to double-sided adhesive tape, may already be applied on chip carrier 226.

Buffer layer 242 may be configured to have a thickness and softness which lowers the risk of damage by the mold tool. The embodiments provide advantageously for applications for which a low-stress assembly of chips 202 is necessary. Second chip side 244 may be covered with gel, although a gel encapsulation may in principal not be necessary. The embodiments provide the possibility of a face down chip assembly whereby a costly flip-chip process, e.g. bumps manufacturing process, need not be used. Instead a cheaper wire-bonding process may be used. It is essential that the second chip side 244 is molded. Based on the widespread stress sensitivity of such chips 202 against mechanical stress, the embodiments provide stress-free embodiments for chip housing particularly through the use of thick elastic glue. This results in an affordable MEMS sensor housing in lab on chip technology.

Illustrations 340 and 350 show a chip-packaging module 200 for chip 202 according to various embodiments. The basic functionalities of the features described with respect to FIG. 2 and FIGS. 3A to 3G, will be referred to and are applicable throughout all the various embodiments which will be described in more detail below, including the chip-packaging module 200 of illustrations 340 and 350, and the chip-packaging module 210 of illustration 360. Identical features are denoted with the same reference signs.

According to an embodiment, the chip-packaging module 200 for chip 202 may include chip 202 including a first chip side 222, wherein first chip side 222 includes an input portion 224 configured to receive a signal. Chip 202 may include an electrical circuit for processing the received signal. Chip carrier 226 may be configured to be in electrical connection with first chip side 222, wherein chip 202 may be mounted to chip carrier 226 via first chip side 222. Chip-packaging module 200 may further include mold material 228 configured to cover chip 200 on at least first chip side 222, wherein at least part of input portion 224 may be released from mold material 228.

According to an embodiment, one or more connection pads 232 may be formed on first chip side 222.

According to an embodiment, chip carrier 226 may be configured to be in electrical connection with at least one of the one or more connection pads 232 formed on first chip side 222.

According to an embodiment, chip 202 may include at least one from the following group of sensors, the group consisting of: electrical sensors, mechanical sensors, electromechanical sensors, microelectromechanical sensors, pressure sensors, gas sensors, chemical sensors, biological sensors, pumps and actuators.

According to an embodiment, input portion 224 may include a membrane.

According to an embodiment, input portion 224 may be configured to receive at least one from the following group of signals, the group consisting of: motion signals, mechanical signals, electrical signals, chemical signals, pressure signals and gaseous signals.

According to an embodiment, chip 202 may include a lab-on-chip.

According to an embodiment, chip carrier 226 may include a chip carrier side 234 adhered to part of first chip side 222.

According to an embodiment, chip carrier 226 may include further chip carrier side 236 configured to be in electrical connection with first chip side 222.

According to an embodiment, chip carrier 226 may further include at least one wire 238 configured to provide the electrical connection between first chip side 222 and chip carrier 226.

According to an embodiment, chip-packaging module 200 may further include buffer layer 242 formed on first chip side 222, wherein the buffer layer 242 lies between chip 202 and chip carrier 226.

According to an embodiment, buffer layer 242 may be configured to adhere at least part of chip carrier side 234 to at least part of first chip side 222.

According to an embodiment, buffer layer 242 may include at least one from the following group of materials, the group consisting of: adhesive glue, epoxy, solder, double-sided tape, elastic polymer, resist, polyimide, bistage material, and thermal adhesive.

According to an embodiment, buffer layer 242 may be configured to isolate input portion 224 from connection pads 232 formed on first chip side 222.

According to an embodiment, mold material 228 may include at least one from the following group of materials, the group consisting of: filled or unfilled epoxy, pre-impregnated composite fibers, laminate, thermoset and thermoplastic material. Any other suitable mold material may be used in alternative embodiments.

According to an embodiment, mold material 228 may be further configured to cover at least part of chip carrier 226.

According to an embodiment, mold material 228 may be further configured to cover chip 202 on at least part of second chip side 244, wherein second chip side 244 faces a direction opposite to first chip side 222.

According to an embodiment, mold material 228 may be formed over at least part of buffer layer 242.

According to an embodiment, chip carrier 226 may include at least one of a leadframe and a laminate.

Illustration 360 shows a chip-packaging module 210 for chip 202 according to an embodiment. Chip-packaging module 210 possess all the features of chip-packaging module 200. Chip-packaging module 210 further includes mold material 228 which may be formed over, e.g. directly on, at least part of buffer layer 242 as well as part of leadframe 226. Therefore, certain parts of buffer layer 242, such as buffer layer 242a need not be covered by leadframe 226.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip-packaging module for a chip, the chip-packaging module comprising:
    a chip comprising a first chip side, wherein the first chip side comprises an input portion configured to receive a signal;
    a chip carrier configured to be in electrical connection with the first chip side, and wherein the chip is mounted to the chip carrier with the first chip side facing the carrier; a mold material configured to cover the chip on at least the first chip side,
    wherein at least part of the input portion is free from the mold material;
    wherein the chip carrier comprises one or more openings for the electrical connection with the first chip side; and
    a buffer layer formed on a surface of the first chip side between the chip and the chip carrier, with a bottom surface of the buffer layer facing the surface of the first chip side,
    wherein a portion of the buffer layer extends into the input portion of said chip, and
    wherein the buffer layer has a top surface opposite to the bottom surface and substantially parallel to the surface of the first chip side and at least a portion of the mold material is formed directly on at least a portion of said top surface of the buffer layer.

2. The chip-packaging module according to claim 1, wherein one or more connection pads are formed on the first chip side.

3. The chip-packaging module according to claim 2, wherein the chip carrier is configured to be in electrical connection with at least one of the one or more connection pads formed on the first chip side.

4. The chip-packaging module according to claim 1, wherein the chip comprises at least one from the following group of sensors, the group consisting of: electrical sensors, mechanical sensors, electromechanical sensors, microelectromechanical sensors, pressure sensors, gas sensors, chemical sensors, biological sensors, pumps and actuators.

5. The chip-packaging module according to claim 1, wherein the input portion comprises a membrane.

6. The chip-packaging module according to claim 1, wherein the input portion is configured to receive at least one from the following group of signals, the group consisting of: motion signals, mechanical signals, electrical signals, chemical signals, pressure signals and gaseous signals.

7. The chip-packaging module according to claim 1, wherein the chip comprises a lab-on-chip.

8. The chip-packaging module of claim 1, wherein the chip carrier comprises a chip carrier side adhered to part of the first chip side.

9. The chip-packaging module of claim 1, wherein the chip carrier comprises a further chip carrier side configured to be in electrical connection with the first chip side.

10. The chip-packaging module of claim 1, wherein the chip carrier further comprises at least one wire configured to provide the electrical connection between the first chip side and the chip carrier.

11. The chip-packaging module of claim 1, further comprising a buffer layer formed on the first chip side, wherein the buffer layer lies between the chip and the chip carrier.

12. The chip-packaging module of claim 11, wherein the buffer layer is configured to adhere at least part of the chip carrier to at least part of the first chip side.

13. The chip-packaging module according to claim 11, wherein the buffer layer may comprise at least one from the following group of materials, the group consisting of: adhesive glue, epoxy, solder, double-sided tape, elastic polymer, resist, polyimide, bistage material, and thermal adhesive.

14. The chip-packaging module according to claim 11, wherein the buffer layer may be configured to isolate the input portion from connection pads formed on the first chip side.

15. The chip-packaging module according to claim 1, wherein the mold material comprises a material selected from a group consisting of: filled or unfilled epoxy, pre-impregnated composite fibers, laminate, thermoset and thermoplastic material.

16. The chip-packaging module of claim 1, wherein the mold material is further configured to cover at least part of the chip carrier.

17. The chip-packaging module of claim 1, wherein the mold material is further configured to cover the chip on at least part of a second chip side, wherein the second chip side faces a direction opposite to the first chip side.

18. The chip-packaging module of claim 11, wherein the mold material is formed over at least part of the buffer layer.

19. The chip-packaging module according to claim 1, wherein the chip carrier comprises at least one of a leadframe and a laminate.

20. A method for forming a chip-packaging module comprising:
    forming a chip carrier in electrical connection with a first chip side, the first chip side comprising an input portion for receiving a signal, and mounting the chip to the chip carrier with the first chip side facing the carrier;

covering the chip with a mold material on at least the first chip side, wherein at least part of the input portion is free from the mold material;

wherein one or more openings are formed in the chip carrier for the electrical connection with the first chip side; and forming a buffer layer on a surface of the first chip side between the chip and the chip carrier, with a bottom surface of the buffer layer facing the surface of the first chip side, wherein a portion of the buffer layer extends into the input portion of said chip, and wherein the buffer layer has a top surface opposite to the bottom surface and substantially parallel to the surface of the surface of the first chip side and at least a portion of the mold material is formed directly on at least a portion of said top surface of the buffer layer.

21. The chip-packaging module according to claim 10, wherein the at least one wire extends through one of the one or more openings in the chip carrier.

22. The chip-packaging module according to claim 21, wherein the at least one wire makes contact to one of one or more contact pads formed on the first chip side.

23. The chip-packaging module according to claim 22, wherein the one or more contact pads are aligned with respective ones of the one or more openings.

* * * * *